(12) United States Patent
Yu

(10) Patent No.: US 6,686,248 B1
(45) Date of Patent: Feb. 3, 2004

(54) METHOD OF FABRICATING A SEMICONDUCTOR DEVICE HAVING A MOS TRANSISTOR WITH A HIGH DIELECTRIC CONSTANT MATERIAL

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 59 days.

(21) Appl. No.: 09/825,658

(22) Filed: Apr. 3, 2001

(51) Int. Cl.[7] .............................................. H01L 21/336
(52) U.S. Cl. ...................... 438/303; 438/287; 438/305; 438/591; 438/595; 257/408; 257/410
(58) Field of Search ................................ 257/408, 410; 438/287, 303, 305, 591, 595

(56) References Cited

U.S. PATENT DOCUMENTS

| | | | |
|---|---|---|---|
| 5,719,607 A | * | 2/1998 | Hasegawa et al. ............. 347/70 |
| 5,793,089 A | * | 8/1998 | Fulford et al. ................ 257/408 |
| 5,929,483 A | * | 7/1999 | Kim et al. .................... 257/336 |
| 6,258,675 B1 | * | 7/2001 | Gardner et al. .............. 257/411 |
| 6,288,419 B1 | * | 9/2001 | Prall et al. ................... 257/213 |
| 6,309,936 B1 | * | 10/2001 | Gardner et al. .............. 438/231 |
| 6,316,304 B1 | * | 11/2001 | Pradeep et al. .............. 257/371 |
| 6,335,238 B1 | * | 1/2002 | Hanttangady et al. ....... 438/240 |
| 6,344,677 B2 | * | 2/2002 | Higuchi ....................... 257/344 |

* cited by examiner

Primary Examiner—Richard Elms
Assistant Examiner—Christian D. Wilson
(74) Attorney, Agent, or Firm—Farjami & Farjami LLP

(57) ABSTRACT

A method for fabricating a semiconductor device, involving: forming a gate stack on a substrate; depositing a material layer on the gate stack; etching the material layer, thereby forming a dielectric capsulate layer on the gate stack; forming a pair of shallow source/drain extensions in a first region of the substrate by implanting a plurality of first dopant ions at a tilt angle with a horizontal offset defined by a thickness of the dielectric capsulate layer; and forming at least one spacer on the dielectric capsulate layer; forming deep source/drain contact junctions in a second region of the substrate by vertically implanting a plurality of second dopant ions below the first region with no tilt and with a horizontal offset defined by a thickness of the at least one spacer.

16 Claims, 2 Drawing Sheets

Figure 1A:
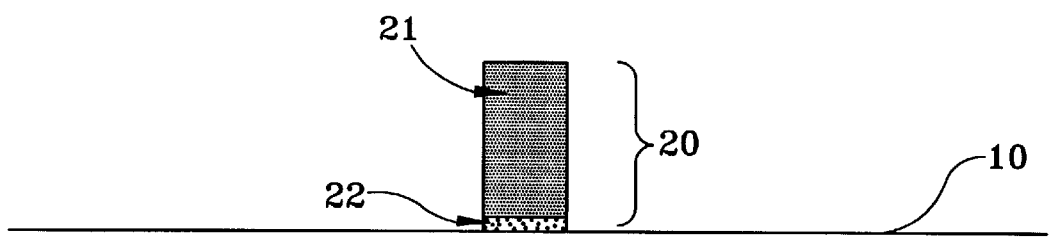

METHOD OF FABRICATING A SEMICONDUCTOR DEVICE HAVING A MOS TRANSISTOR WITH A HIGH DIELECTRIC CONSTANT MATERIAL

CROSS-REFERENCE TO RELATED APPLICATION(S)

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

The present invention relates to small high density semiconductor devices. More particularly, the present invention relates to forming MOS transistors in semiconductor devices. Even more particularly, the present invention relates to eliminating contamination when using high-k materials during fabrication of a MOS transistor in a semiconductor device.

2. Description of the Background Art

As the critical dimensions of transistors continues to be reduced, the thickness of the gate oxide also requires reduction. Currently, the greatest challenge in the effort to reduce gate oxide thickness, is the elimination of the dramatically increasing direct tunneling leakage current through a very thin gate oxide (i.e., <25 Angstroms). In order to suppress such severe gate current leakage current, a high dielectric constant (high-k) material must be used as a gate dielectric to replace the conventional thermal oxide. Further, this high-k material must have a physical thickness much greater than that of the conventional thermal oxide. The direct current density is exponentially proportional to the dielectric material's physical thickness. Therefore, the direct tunneling current flow through the gate insulator is significantly reduced. This is the major motivation of using a high dielectric constant material as a gate insulator for a very small transistor. A few metal oxides exist, such as titanium dioxide ($TiO_2$) and tantalum pentoxide ($Ta_2O_5$), which can be used as a high-k material.

However, one of the greatest problems associated with using high-k materials is the potential contamination occurring during post-gate-processing steps, such as during ion implantation. The sputter-out metal atoms (e.g., Ti and Ta) may cause contamination to the implantation chamber. Therefore, a need exists for a new process using high-k materials without creating potential metal contamination.

BRIEF SUMMARY OF THE INVENTION

Accordingly, the present invention generally provides a method of forming a semiconductor device having a MOS transistor with a high dielectric constant material without metal contamination. In particular, the present invention method comprises forming a protective layer comprising a dielectric capsulate layer on at least one sidewall of a gate stack. The dielectric capsulate layer may be formed from a material such as an oxide.

By way of example, and not of limitation, a semiconductor device having a MOS transistor with a high dielectric constant material without metal contamination is fabricated in accordance with the present invention by: (a) forming a gate stack, comprising a high dielectric constant material layer, such as $TiO_2$ and $Ta_2O_5$, on a semiconductor substrate; (b) forming a gate electrode, such as polysilicon, on the high dielectric constant material layer; (c) depositing a low dielectric constant material (low-k) layer, such as silicon dioxide ($SiO_2$), preferably having a thickness in a range of approximately 150 Angstroms to approximately 250 Angstroms on the gate 20 and on at least one exposed portion of the substrate; (d) etching the low dielectric constant material layer, thereby forming a dielectric capsulate layer on at least one sidewall of the gate stack; (e) forming a pair of shallow source/drain extensions (S-S/D-E) in a first region of the substrate, preferably by implanting a plurality of first dopant ions at a tilt angle θ with a horizontal offset w defined by a thickness of the dielectric capsulate layer; (f) forming at least one spacer comprising a thin liner, such as silicon dioxide ($SiO_2$), on the low-k layer and on a portion of the substrate; (g) forming a spacer material, such as silicon nitride ($Si_3N_4$), on the thin liner; (h) forming a pair of deep source/drain contact junctions (D-S/D-J) in a second region of the substrate below the first region, by vertically implanting a plurality of second dopant ions at an approximately zero degree tilt angle with a horizontal offset d defined by a thickness of the at least one spacer; and (I) completing fabrication of the semiconductor device.

Advantages of the present invention include providing a method for using high-k materials to suppress severe gate current leakage current and a method for using high-k materials without creating metal contamination. Further advantages of the invention will be brought out in the following portions of the specification, wherein the detailed description is for the purpose of fully disclosing preferred embodiments of the invention without thereon placing limitations.

BRIEF DESCRIPTION OF THE DRAWING(S)

For a better understanding of the present invention, reference is made to the below-referenced accompanying Drawing which is/are for illustrative purposes and where like reference numbers denote like elements in the several figures of the Drawing.

FIG. 1A through FIG. 1E, together, constitute a process flow diagram of the fabrication of a semiconductor device, in accordance with the present invention, wherein the semiconductor device is shown in cross-section at various stages of the process.

DETAILED DESCRIPTION OF THE INVENTION

Referring more specifically to the drawings for illustrative purposes, the present invention is embodied in the apparatus and method generally shown in FIG. 1A through FIG. 1E. These figures depict an embodiment of a process for fabricating a semiconductor device having a MOS transistor with a high dielectric constant material layer without metal contamination. Each figure illustrates a particular processing stage, and presents a side view in cross-section of the device at that stage of processing. However, that the apparatus may vary as to configuration and as to details of the parts, and that the method may vary as to the specific steps and sequence, without departing from the basic concepts as disclosed herein, will be appreciated.

Referring first to FIG. 1A, in the first stage of processing, a gate stack 20 having a high dielectric constant material layer 22, such as tantala or tantalum pentoxide (Ta$_2$O$_5$), titania or titanium dioxide (TiO$_2$), hafnia or hafnium dioxide (HfO$_2$), zirconia or zirconium dioxide (ZrO$_2$), alumina or aluminum oxide (Al$_2$O$_3$), and the like, is formed on a semiconductor substrate 10, and a gate electrode 21, such as polysilicon (poly-Si) and polysilicon-germanium (poly-SiGe), is formed on the high dielectric constant material layer 22.

Figure 1B:
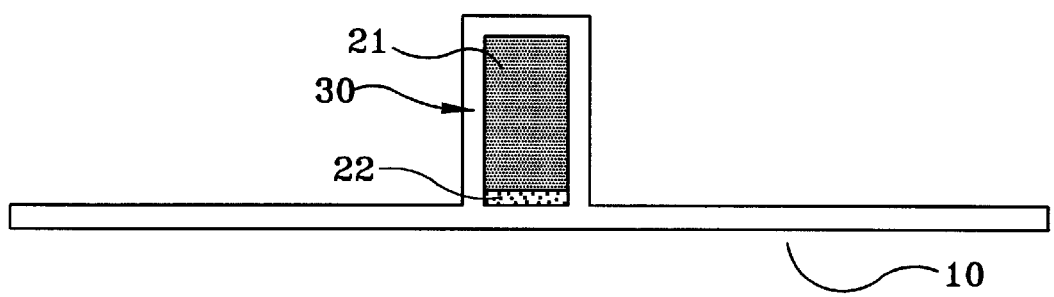

Next, as shown in FIG. 1B, a material layer 30, such as an oxide or a silicon dioxide (SiO$_2$), preferably having a thickness in a range of approximately 150 Angstroms to 250 Angstroms, is deposited on the gate stack 20 and on at least one exposed portion of the substrate 10.

Figure 1C:
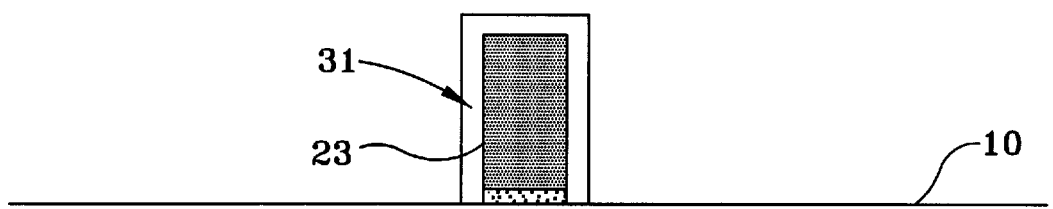

Next, as shown in FIG. 1C, the low dielectric constant material layer 30 is etched, thereby forming a dielectric capsulate layer 31 as a protective layer on at least one sidewall 23 of the gate stack 20.

Figure 1D:
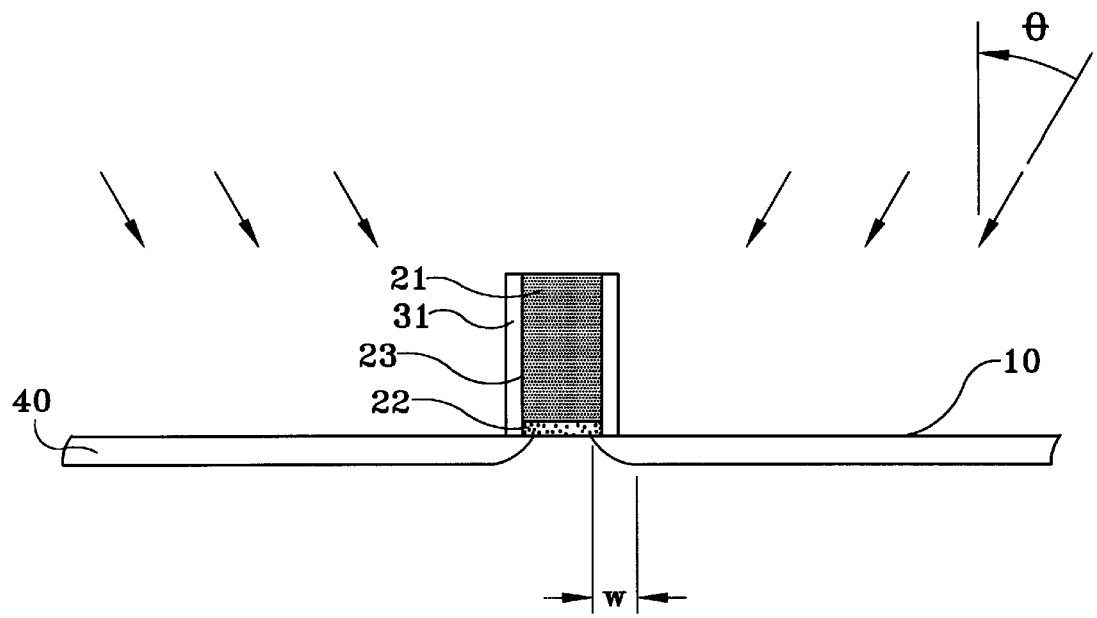

Then, as shown in FIG. 1D, a pair of shallow source/drain extensions (S-S/D-E) 40 are formed, preferably by implanting a plurality of first dopant ions, such as boron (B) for an p-channel FET, boron difluoride (BF$_2$) for an p-channel FET, arsenic (As) for an n-channel FET, and phosphorous (P) for an n-channel FET, in a first region of the substrate 10 at a tilt angle θ with a horizontal offset w defined by a thickness of the dielectric capsulate layer 31.

Figure 1E:
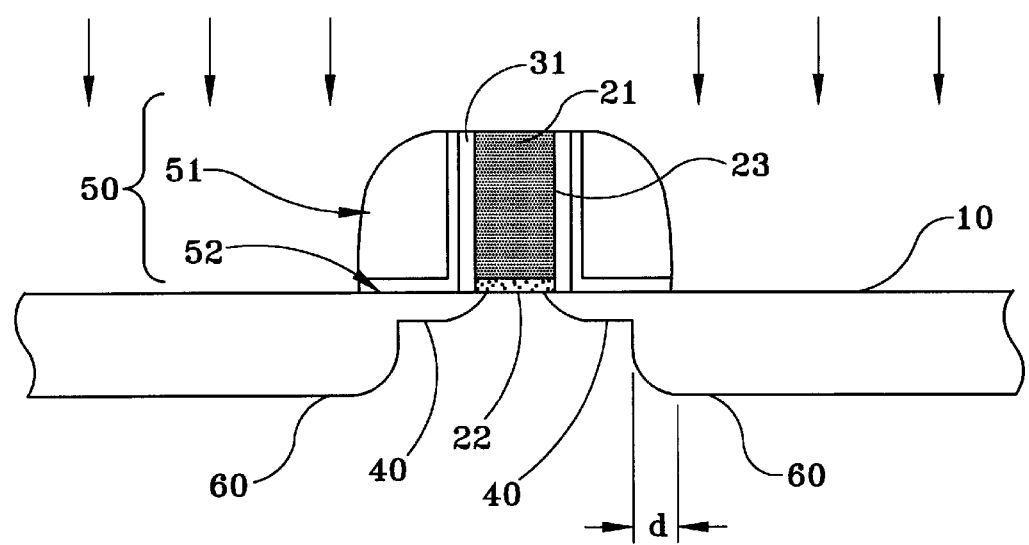

As depicted in FIG. 1E, at least one spacer 50 is then formed on the dielectric capsulate layer 31 and on the S-S/D-Es 40. The spacer(s) preferably comprise a thin liner 52, such as silicon dioxide (SiO$_2$), deposited on the dielectric capsulate layer 31, and a spacer material 51, such as a silicon nitride (Si$_3$N$_4$), deposited on the thin liner 52. A pair of deep source/drain contact junctions (D-S/D-J) are then formed in a second region of the substrate below the first region, by vertically implanting a plurality of second dopant ions, such as boron (B) for an p-channel FET, boron difluoride (BF$_2$) for an p-channel FET, arsenic (As) for an n-channel FET, and phosphorous (P) for an n-channel FET, at an approximately zero degree tilt angle with a horizontal offset d defined by a thickness of the at least one spacer. Fabrication of the semiconductor device is then completed according to conventional processing techniques.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A method of fabricating a semiconductor device, having a MOS transistor with a high dielectric constant material layer without metal contamination, comprising:
   depositing at least one dielectric capsulate layer as a protective layer on at least one sidewall of at least one gate stack formed on a semiconductor substrate,
   said at least one gate stack comprising:
   a high dielectric constant material layer formed on said substrate; and
   a gate electrode formed on said high dielectric constant material layer,
   said high dielectric constant material layer comprising a material selected from a group consisting of tantalum pentoxide (Ta$_2$O$_5$), titanium dioxide (TiO$_2$), hafnium dioxide (HfO$_2$), zirconium dioxide (ZrO$_2$), and aluminum oxide (Al$_2$O$_3$), and
   said gate electrode comprising a material selected from a group consisting of polysilicon (poly-Si) and polysilicon-germanium (poly-SiGe).

2. A method, as recited in claim 1, wherein said at least one dielectric capsulate layer depositing step comprises depositing at least one low dielectric constant material layer on said at least one gate stack and on at least one exposed portion of said semiconductor substrate.

3. A method, as recited in claim 2, wherein the gate stack defines at least one sidewall, and wherein said at least one dielectric capsulate layer depositing step includes etching away all said at least one low dielectric constant material layer not on the at least one sidewall.

4. A method, as recited in claim 1,
   wherein said at least one material layer comprises a material selected from a group consisting of oxide and silicon dioxide (SiO$_2$),
   wherein the high dielectric constant material layer is less than approximately 25 Angstroms thick, and
   wherein said at least one material layer has a thickness in a range of approximately 150 Angstroms to approximately 250 Angstroms.

5. A method, as recited in claim 1, further comprising:
   forming at least one pair of shallow source/drain extensions (S-S/D-E) in at least one first region of said substrate by implanting a plurality of first dopant ions,
   wherein said plurality of first dopant ions comprises at least one dopant selected from a group consisting of boron (B) for an p-channel FET, boron difluoride (BF$_2$) for an p-channel FET, arsenic (As) for an n-channel FET, and phosphorous (P) for an n-channel FET;
   forming at least one spacer on said at least one dielectric capsulate layer and on said at least one pair of S-S/D-Es; and
   forming at least one pair of deep source/drain contact junctions (D-S/D-J) in a second region of said substrate below said at least one pair of S-S/D-Es by implanting a plurality of second dopant ions,
   wherein said plurality of second dopant ions comprises at least one dopant selected from a group consisting of boron (B) for an p-channel FET, boron difluoride (BF$_2$) for an p-channel FET, arsenic (As) for an n-channel FET, and phosphorous (P) for an n-channel FET.

6. A method, as recited in claim 5, wherein said implanting of said plurality of first dopant ions in said first region is performed at a tilt angle θ, where θ is approximately zero degrees with a horizontal offset (setback) w defined by a thickness of said dielectric capsulate layer.

7. A method, as recited in claim 5, wherein said at least one spacer comprises:
   a thin liner deposited on said dielectric capsulate layer and on said at least one pair of S-S/D-Es; and
   a spacer material deposited on said thin liner.

8. A method, as recited in claim 5, wherein said step of vertically implanting said plurality of second dopant ions in said second region of said substrate is performed at approximately a zero degree (~0°) tilt angle with a horizontal offset (setback) d defined by a thickness of said at least one spacer.

9. A method of fabricating a semiconductor device, having a MOS transistor with a high dielectric constant material layer without metal contamination, comprising:
   depositing at least one material layer on at least one gate stack formed on a semiconductor substrate and on at least one exposed portion of said semiconductor substrate; and
   forming at least one dielectric capsulate layer as a protective layer on at least one sidewall of said at least one gate stack,
   said at least one gate stack comprising:
      a high dielectric constant material layer formed on said substrate; and
      a gate electrode formed on said high dielectric constant material layer,
   said high dielectric constant material layer comprising a material selected from a group consisting essentially of tantalum pentoxide ($Ta_2O_5$), titanium dioxide ($TiO_2$), hafnium dioxide ($HfO_2$), zirconium dioxide ($ZrO_2$), and aluminum oxide ($Al_2O_3$), and
   said gate electrode comprising a material selected from a group consisting essentially of polysilicon (poly-Si) and polysilicon-germanium (poly-SiGe).

10. A method, as recited in claim 9, wherein the gate stack defines at least one sidewall, and wherein said at least one dielectric capsulate layer depositing step includes etching away all said at least one dielectric material layer not on the at least one sidewall.

11. A method, as recited in claim 10, wherein said completing step comprises:
   forming at least one pair of shallow source/drain extensions (S-S/D-E) in at least one first region of said substrate by implanting a plurality of first dopant ions,
   wherein said plurality of first dopant ions comprises at least one dopant selected from a group consisting essentially of boron (B) for an p-channel FET, boron difluoride ($BF_2$) for an p-channel FET, arsenic (As) for an n-channel FET, and phosphorous (P) for an n-channel FET;
   forming at least one spacer on said at least one dielectric capsulate layer and on said at least one pair of S-S/D-Es; and
   forming at least one pair of deep source/drain contact junctions (D-S/D-J) in a second region of said substrate below said at least one pair of S-S/D-Es by implanting a plurality of second dopant ions,
   wherein said plurality of second dopant ions comprises at least one dopant selected from a group consisting essentially of boron (B) for an p-channel FET, boron difluoride ($BF_2$) for an p-channel FET, arsenic (As) for an n-channel FET, and phosphorous (P) for an n-channel FET.

12. A method, as recited in claim 11,
   wherein said at least one material layer comprises a material selected from a group consisting of oxide and silicon dioxide ($SiO_2$),
   wherein the high dielectric constant material layer is less than approximately 25 Angstroms thick, and
   wherein said at least one material layer has a thickness in a range of approximately 150 Angstroms to approximately 250 Angstroms.

13. A method, as recited in claim 12, wherein said implanting said plurality of first dopant ions in said first region is performed at a tilt angle θ, where θ is approximately zero degrees, with a horizontal offset (setback) w defined by a thickness of said dielectric capsulate layer.

14. A method, as recited in claim 13, wherein said at least one spacer comprises:
   a thin liner deposited on said dielectric capsulate layer and on said at least one pair of S-S/D-Es; and
   a spacer material deposited on said thin liner.

15. A method, as recited in claim 14, wherein said step of vertically implanting said plurality of second dopant ions in said second region of said substrate is performed at approximately a zero degree tilt angle with a horizontal offset (setback) d defined by a thickness of said at least one spacer.

16. A method of fabricating a semiconductor device, having a MOS transistor with a high dielectric constant material layer without metal contamination, comprising:
   forming at least one dielectric capsulate layer as a protective layer on at least one sidewall of at least one gate stack formed on a semiconductor substrate, wherein said at least one dielectric capsulate layer forming step comprises:
      depositing at least one low dielectric constant material layer on said at least one gate stack and on at least one exposed portion of said semiconductor substrate, and
      etching away all of said at least one low dielectric constant material layer not residing on the at least one sidewall;
   forming at least one pair of shallow source/drain extensions (S-S/D-E) in at least one first region of said substrate by implanting a plurality of first dopant ions, wherein said plurality of first dopant ions comprises at least one dopant selected from a group consisting of boron (B) for an p-channel FET, boron difluoride ($BF_2$) for an p-channel FET, arsenic (As) for an n-channel FET, and phosphorous (P) for an n-channel FET;
   forming at least one spacer on said at least one dielectric capsulate layer and on said at least one pair of S-S/D-Es; and
   forming at least one pair of deep source/drain contact junctions (D-S/D-J) in a second region of said substrate below said at least one pair of S-S/D-Es by implanting a plurality of second dopant ions, wherein said plurality of second dopant ions comprises at least one dopant selected from a group consisting of boron (B) for an p-channel FET, boron difluoride ($BF_2$) for an p-channel FET, arsenic (As) for an n-channel FET, and phosphorous (P) for an n-channel FET,
   wherein said at least one gate stack comprises:
      a high dielectric constant material layer formed on said substrate; and
      a gate electrode formed on said high dielectric constant material layer, wherein said high dielectric constant material layer comprises a material selected from a group consisting of tantalum pentoxide ($Ta_2O_5$), titanium dioxide ($TiO_2$), hafnium dioxide ($HfO_2$), zirconium dioxide ($ZrO_2$), and aluminum oxide ($Al_2O_3$), wherein said gate electrode comprises a material selected from a group consisting of polysilicon (poly-Si) and polysilicon-germanium (poly-SiGe), wherein said at least one material layer comprises a material selected from a group consisting of oxide and silicon dioxide ($SiO_2$), wherein the high dielectric constant material layer is less than approximately 25 Angstroms thick, wherein said at least one material layer has a thickness in a range of approximately 150 Angstroms to approximately 250 Angstroms, wherein said implanting of said plurality of first dopant ions in said first region is performed at a tilt angle $\theta$, where $\theta$ is approximately zero degrees with a horizontal offset (setback) w defined by a thickness of said dielectric capsulate layer, wherein said at least one spacer comprises:
 a thin liner deposited on said dielectric capsulate layer and on said at least one pair of S-S/D-Es; and
 a spacer material deposited on said thin liner, and
 wherein said step of vertically implanting said plurality of second dopant ions in said second region of said substrate is performed at approximately a zero degree (~0°) tilt angle with a horizontal offset (setback) d defined by a thickness of said at least one spacer.

* * * * *